United States Patent [19]

Nakayama

[11] Patent Number: 4,994,894

[45] Date of Patent: Feb. 19, 1991

[54] SEMICONDUCTOR DEVICE HAVING AN IMPROVED WIRING PATTERN

[75] Inventor: Takeo Nakayama, Tokyo, Japan

[73] Assignee: Kabushiki Kaisha Toshiba, Kawasaki, Japan

[21] Appl. No.: 293,848

[22] Filed: Jan. 5, 1988

[30] Foreign Application Priority Data

Jan. 21, 1988 [JP] Japan .................................. 63-11390

[51] Int. Cl.$^5$ ............................................ H01L 23/48
[52] U.S. Cl. ........................................ 357/71; 357/68; 357/65
[58] Field of Search ...................... 357/71, 71 S, 71 P, 357/68, 65

[56] References Cited

U.S. PATENT DOCUMENTS

4,549,199 10/1985 Yamauchi et al. .................. 357/68

Primary Examiner—Rolf Hille
Assistant Examiner—Wael Fahmy
Attorney, Agent, or Firm—Finnegan, Henderson, Farabow, Garrett and Dunner

[57] ABSTRACT

A semiconductor device comprises a semiconductor substrate having a diffused region and an element region, and the diffused region and the element region overlap at least partially. An insulating layer having a contact hole is provided at the surface of the substrate. A wiring layer crosses over the contact hole to form at least four crossing points with respect to the contact hole. The crossing points over the element region correspond to the overlap between the diffused region and the element region.

1 Claim, 7 Drawing Sheets

PRIOR ART

PRIOR ART

SEMICONDUCTOR DEVICE HAVING AN IMPROVED WIRING PATTERN

BACKGROUND OF THE INVENTION

1. Field of the Invention

This invention concerns a semiconductor device, and more particularly an improvement of the wiring pattern connection to a contact hole thereof.

2. Description of the Prior Art

Conventionally, to form an electrical path between a wiring layer and a source or a drain region in a MOS type semiconductor device, an underlying diffused region is formed to be connected with the wiring layer, which is formed at the formation of the gate electrode and made of the same material as the gate electrode.

Figure 1A:
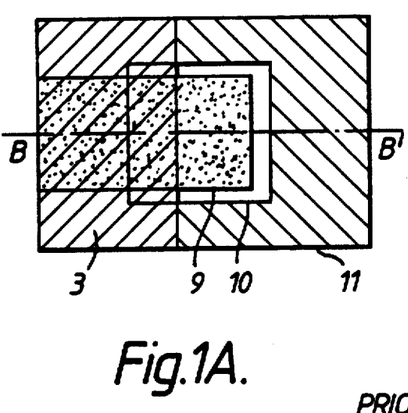
FIG. 1A is a plan view of a conventional pattern of a wiring layer for a connection to an underlying diffused layer.
Figure 1B:
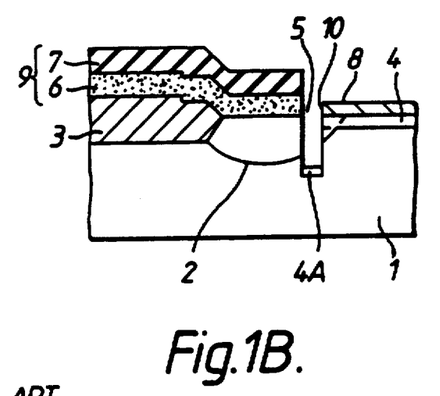
FIG. 1B is a cross sectional view along line B-B' of FIG. 1A.

FIGS. 1A and 1B show an example of such a prior art wiring arrangement. FIG. 1A is a plan view, and FIG. 1B is a cross sectional view along the line B-B' of FIG. 1A. In FIG. 1B, numeral 1 designates a semiconductor substrate, and numeral 2 designates an underlying diffused layer. Numeral 3 is a device separation region, and numeral 4 is a source or drain region (hereafter called as a source region). Numeral 8 is a gate insulating layer, and numeral 9 is a wiring layer of multi-layer construction composed of a poly-Si layer 6 and a refractory metal layer 7. As shown in FIG. 1A, the wiring layer 9 contacts with the underlying diffused layer 2 within the contact hole 10.

The fabrication process of the device is as follows. After the formation of the contact hole 10, a poly-Si layer doped with impurities is deposited, and a thermal treatment is carried out to form the underlying diffused layer 2 by diffusing impurities from the poly-Si layer to the substrate. Next, a refractory metal layer is deposited on the poly-Si layer to lower the resistance. Next, an etching process is carried out to pattern and make a patterned wiring layer 9. The condition of the etching is chosen so that the gate insulating layer 8 is not etched during this process.

However, in this construction, the leading edge of the wiring layer 9 ends within the contact hole 10. Thus, in the etching process, the exposed substrate between the insulating layer 8 and the wiring layer 9 is etched, and a trench region 5 is formed. Next, an ion implantation is carried out to form a source and a drain regions at the surface of the substrate, using the wiring layer 9 as a mask. Numeral 4A designates a diffused region formed at the implantation step.

The trench region 5 intersects the underlying diffused region 2. Thus, the conductive path between the wiring layer 9 and the source region 4 is cut off. Therefore, it is necessary to form the underlying diffused layer 2 deeply to avoid the discontinuity due to the trench region 5. However, deep diffusion of the underlying diffused region 2 is unfavorable for high integration of elements.

Figure 2A:
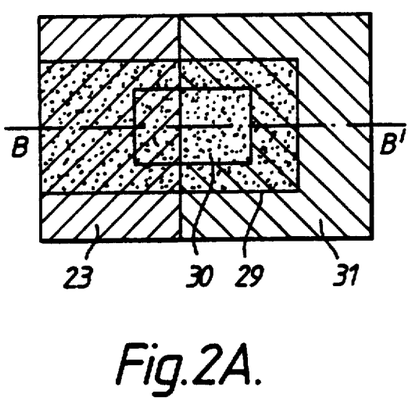
FIG. 2A is a plan view of another conventional pattern of wiring layer.
Figure 2B:
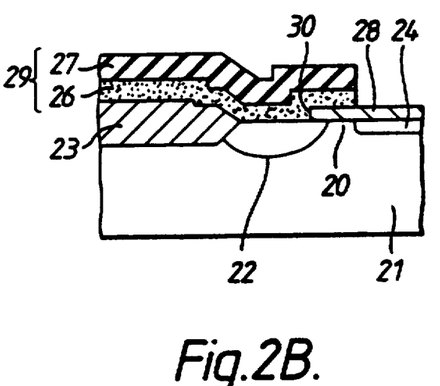
FIG. 2B is a cross sectional view along line B-B' of FIG. 2B.

FIGS. 2A and 2B show another example of conventional wiring pattern. FIG. 2A is a plan view, and FIG. 2B is a cross sectional view along the line B-B' of FIG. 2A. In this example, the wiring layer 29 covers the contact hole 30 completely. The formation step is the same to that of FIGS. 1A and 1A.

In this example, the substrate within the contact hole 30 is not exposed to the etching process for the patterning of the wiring layer 29. Thus, there is no formation of the unfavorable trench region like FIG. 2B. However, there may exist an un-implanted region 20 between the underlying diffused region 22 and the source (or drain) region 24. Thus, in this construction, it is necessary to deeply form the underlying diffused region 22, so as to connect the regions 22 and 24, using a lateral diffusion of the underlying diffused region 22. The deep formation of the region 22 is unfavorable for high integration of elements.

SUMMARY OF THE INVENTION

Therefore, an object of this invention is to provide an improved contact construction which allows a high integration of the semiconductor device.

Another object of this invention is to provide an improved semiconductor device wherein the underlying diffused region and an element region, e.g., source or drain region of a MOS transistor, are surely electrically connected, even if the underlying diffused region is shallowly diffused.

Further object of this invention is to provide a method for manufacturing the device.

To achieve the object, this invention provides a semiconductor device comprising: a semiconductor substrate having a diffused region and an element region, the diffused region and the element region overlapping at least partially; an insulating layer formed at the surface of the substrate, and having a contact hole exposing the diffused region; and a wiring layer crossing over the contact hole, having at least four crossing points with respect to the contact hole.

Furthermore, this invention provides a method for manufacturing a semiconductor device comprising the steps of: preparing a semiconductor substrate; forming an insulating layer on the surface of the substrate; forming a contact hole within the insulating layer; forming a wiring layer doped with impurities, and having at least four crossing points at the periphery of the contact hole; diffusing impurities into the substrate from the wiring layer to form a diffused region; introducing impurities into the substrate using the wiring layer as a mask to form an element region; and forming overlapping portions of the diffused region and the element region under the crossing points of the wiring layer with respect to the boundary of the element region with the diffused region.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. Of the drawings:

FIGS. 3A to 6A are plan views, and FIGS. 3B to 6D are cross sectional views, for explaining the steps of manufacturing a preferred embodiment of this invention.

FIGS. 7A to 11A are plan views.

DETAILED DESCRIPTION OF THE INVENTION

Referring now to FIGS. 3A to 6A, and 3B to 6D, there are illustrated plan views and cross sectional views showing steps of manufacturing a semiconductor device having an improved wiring pattern according to this invention.

Figure 3A:
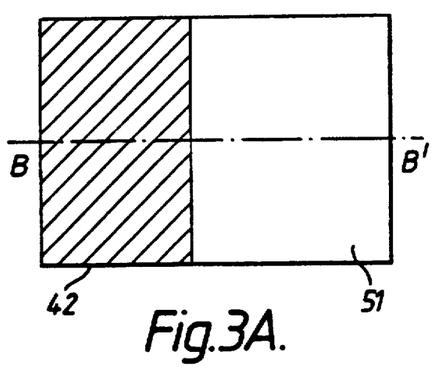
Figure 3B:
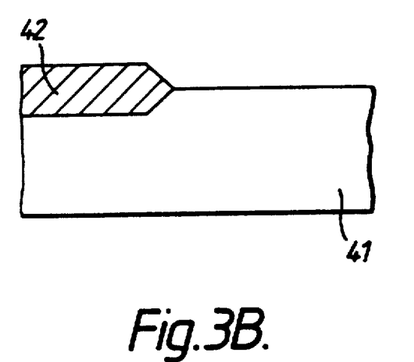

At first, a semiconductor substrate 41 of a first conductivity, e.g., P-type, is prepared. Next, a device separation region 42 is formed. This separation region 42 is formed as follows. At first, an oxide layer of 500 Å thickness is formed by a thermal oxidation at 950° C., and a silicon nitride (SiN) layer of 500 Å is deposited thereon. Next, the SiN layer above the area wherein an element would be formed (hereafter called as an element region) is removed by a lithography technique using Chemical Dry Etching (CDE). Next, an oxide layer of 8000 Å is formed at the surface of the substrate 41 by a thermal oxidation at 1000° C. Then the remaining SiN layer is removed using chemical dry etching. Then, the remaining oxide layer on the element region 51 is removed using an ammonium fluoride (NH$_4$F) etchant.

Figure 4A:
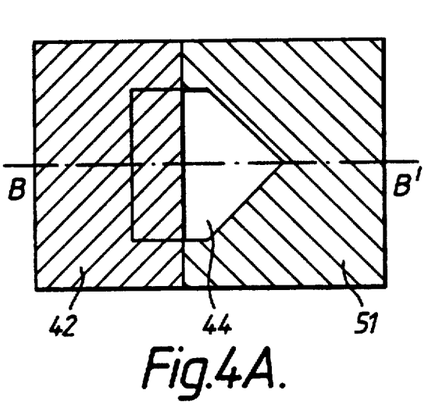
Figure 4B:
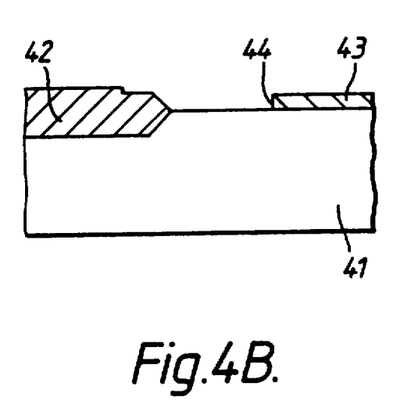

Next, as shown in FIGS. 4A and 4B, an oxide layer 43 of 300 Å is formed by a dry oxidation process at 900° C. Then, the oxide layer is selectively etched using a lithography technique and an NH$_4$F etchant to form a contact hole 44.

Then, a poly-Si layer 46 of 4000 Å for a wiring layer is formed by a Chemical Vapor Deposition (CVD) method. The poly-Si layer 46 is doped with phosporus by a thermal treatment in an atomosphere of POCl$_3$ for 40 minutes at 900° C., for reducing the resistance thereof.

Next, a thermal treatment is carried out to diffuse phosporus into the substrate from the poly-Si layer 46, to form an underlying diffused layer 45.

Figure 5A:
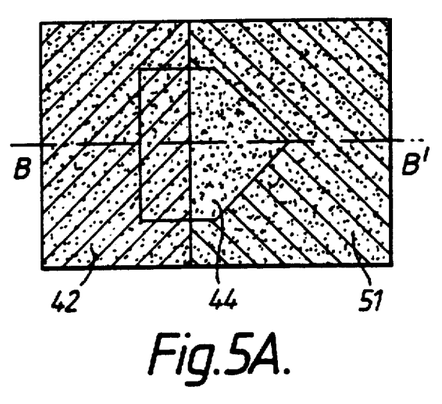
Figure 5B:
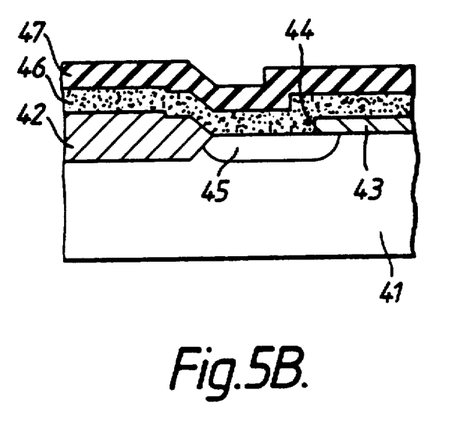

Then, a refractory metal or refractory metal silicide 47, such as Mo, MoSix, W, WSix, Ti and Tix., is deposited by sputtering on the poly-Si layer 46 to reduce the resistance (FIGS. 5A, 5B).

Figure 6A:
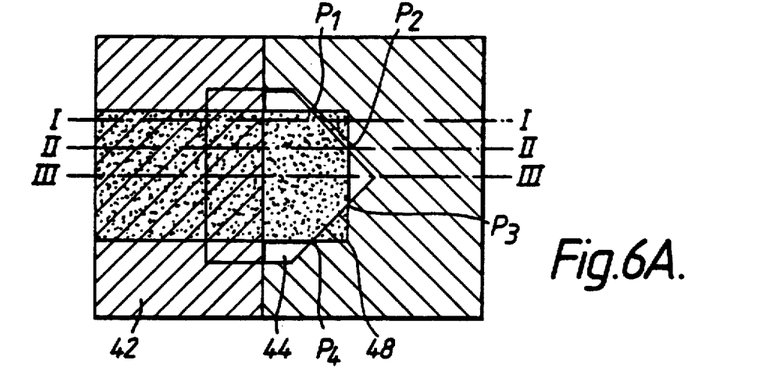

Then, an etching process is carried out to pattern the layers 46 and 47 to form a predetermined wiring layer 48 (FIG. 6A). In this step, a gate electrode (not shown) of a MOS transistor is formed simultaneously. It should be noted that the wiring layer 48 crosses the contact hole 44 on the element region 51. Namely, there exists four crossing points P1, P2, P3 and P4. In this embodiment, the contact hole 44 is a pentagon. Next, phosphorus is introduced by ion implantation in a dose of $5 \times 10^{13}$ cm$^{-2}$ by applying an accelerating voltage of 40 KeV, using the wiring layer 48 as a mask. Then, a thermal treatment is carried out for an activation, and to form a source or a drain region 49. Hereafter, an explanation is done referring the region 49 as a source region.

After that, an interlayer insulator (not shown) is formed, and a planarization using a well known method is carried out. Then, a contact hole is formed, a metalic layer is formed, and the metalic layer is patterned to form a wiring layer (not shown), using conventional process.

Figure 6B:
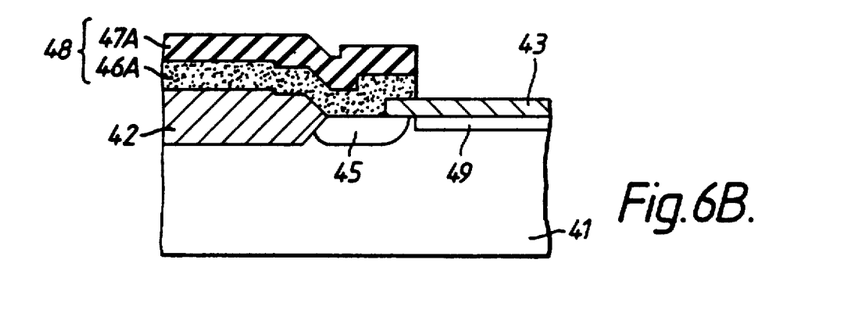
Figure 6C:
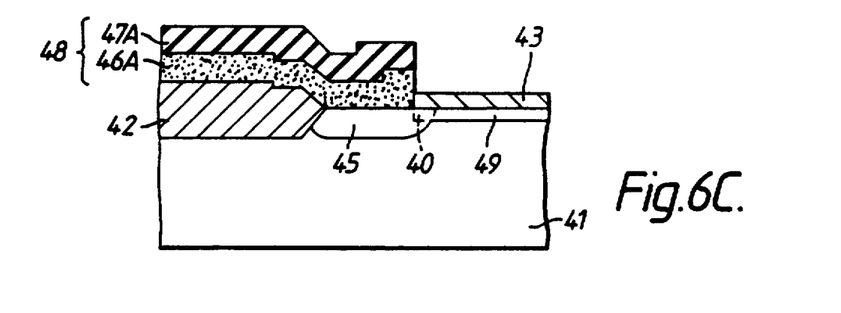
Figure 6D:
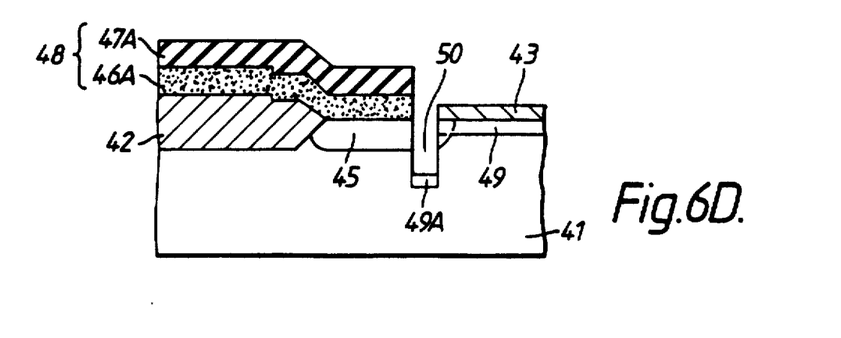

FIGS. 6B to 6D are cross sectional views along the lines I—I, II—II and III—III of FIG. 6A, respectively. As shown in FIG. 6B, at the portion where the wiring layer 48 projects over the insulating layer 43, there may exist an unconnected portion between the underlying diffused layer 45 and the source region 49.

On the contrary, at the crossing point P2, the underlying diffused region 45 and a source region 49 overlaps to form a connection portion 40. Namely, the surface of the underlying diffused region 45 is not subjected to the etching process for the patterning of the wiring layer 49, due to the existence of the insulating layer 43. Thus, no unfavorable trench region is formed.

At the portion where the wiring layer 48 ends within the contact hole 44, there exists an unfavorable trench region 50, as shown in FIG. 6C.

However, as explained previously, at the crossing point P2, the underlying diffused region 45 and the source region 49 oontact each other. Therefore, an electrically conductive path between the wiring layer 48 and the source region 49 is obtained. Namely, even if the underlaying diffused region 45 is formed shallowly, there exists a overlapping portion 40 at the crossing point. Thus, a high integration semiconductor device is possible.

FIGS. 7A to 11A and 7B to 7D are plan views and cross sectional views explaining the steps of the manufacturing of another embodiment of this invention.

In this embodiment, a double layer construction is utilized for device separation to prevent the lowering of the insulation capacity due to a minimization of the device separation region.

Figure 7A:
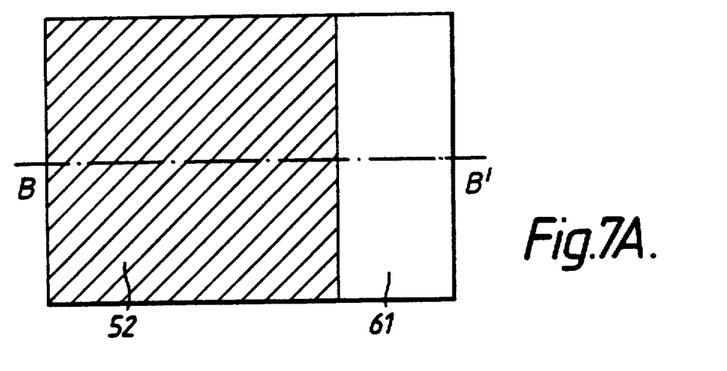
Figure 7B:
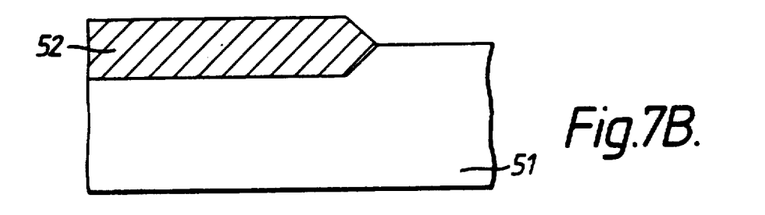

At first, a semiconduotor substrate of P-type is prepared, and a first device separation region 52 is formed in the same way of the first embodiment.

Figure 8A:
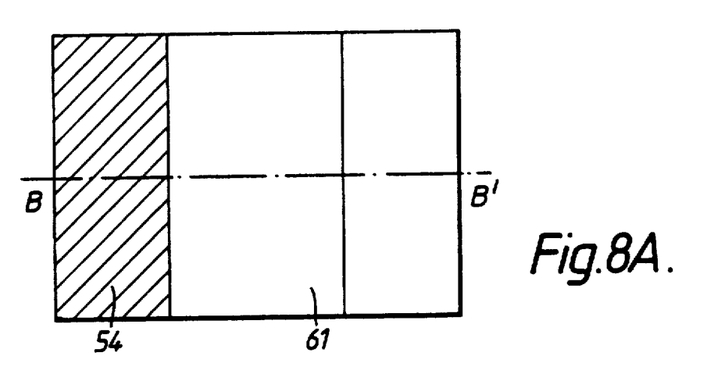
Figure 8B:
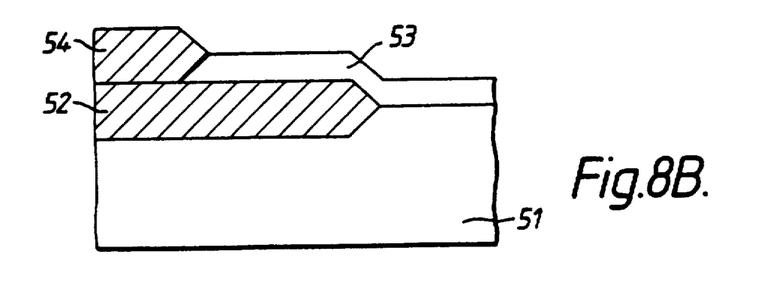

Next, an epitaxial layer 53 of 0.2 μm is formed by an epitaxial growth at 950° C. Then, an oxide layer (not shown) of 500 Å is formed by a dry oxidation method at 850° C. Then, a SiN layer of 500 Å (not shown) is formed by a CVD method. Next, the SiN layer is selectively etched to remove the portion over the area where an element will be formed thereafter (hereafter called as an element region), by a lithography technique using CDE. Then, an oxidation process is carried out to form an oxide layer 54 of 4500 Å using a thermal oxidation. Thereafter, the remaining SiN layer is removed by a CDE process, and also the remaining oxide layer on the element region of the epitaxial layer 53 is removed using an NH$_4$F etchant. In this way, a first thick device separation region 52 and a second thin device separation region 54 are formed (FIGS. 8A, 8B).

Figure 9A:
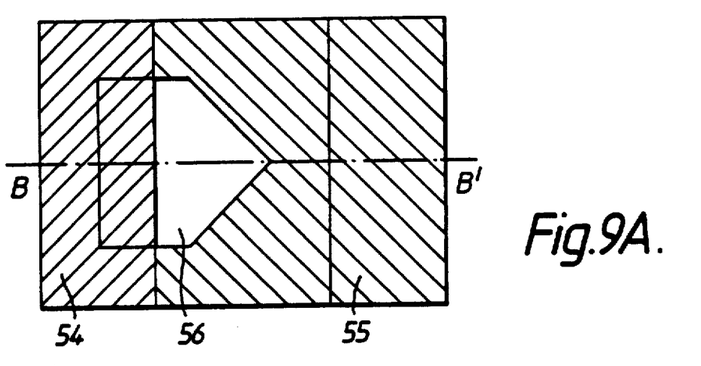
Figure 9B:
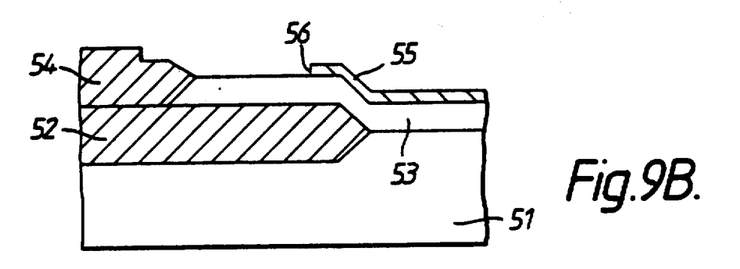

Next, an oxide layer 55 of 100 Å is formed in an atmosphere of dry oxygen including chlorine of 10 % at 800° C. Next, a contact hole 56 is formed by a lithography technique and an NH$_4$F etchant (FIGS. 9A, 9B).

Then, a poly-Si layer 57 of 2000 Å is deposited on the substrate by CVD process. The poly-Si layer 57 is doped with phosporus by a thermal treatment in an atomosphere of POCl$_3$ for 30 minutes at 900° C., for reducing the resistance thereof.

Next, a thermal treatment is carried out to diffuse phosporus into the substrate from the poly-Si layer 57, to form an underlying diffused layer 59.

Figure 10A:
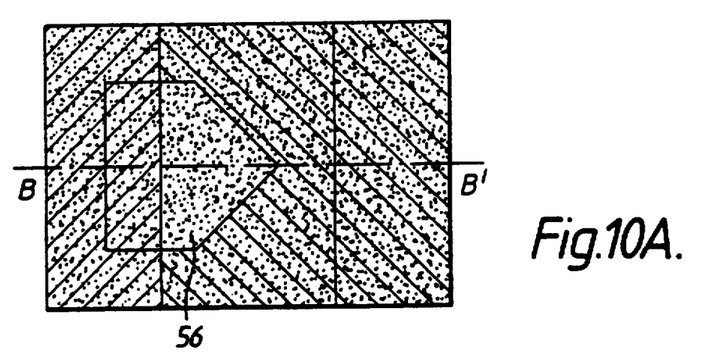
Figure 10B:
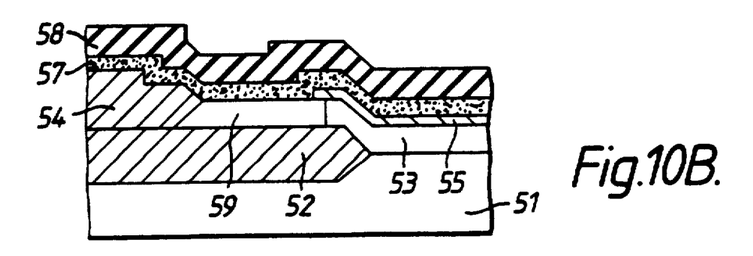

Then, a refractory metal 58, such as Mo, MoSix, W, WSix, Ti and Tix., is deposited by sputtering on the poly-Si layer 57 to reduce resistance (FIGS. 10A, 10B).

Figure 11A:
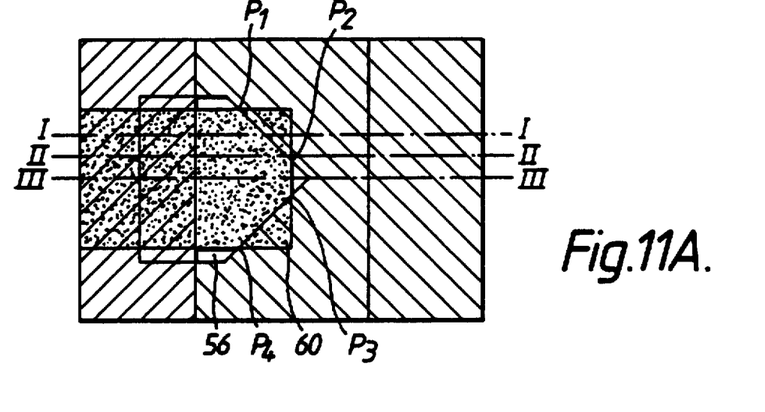

Then, an etching process is carried out to pattern the layers 57 and 58 to form a predetermined wiring layer 60 (FIG. 11A). In this step, a gate electrode (not shown) of a MOS transistor is formed simultaneously. It should be noted that the wiring layer 60 crosses the contact hole 56 on the element region 61. Namely, there exists four crossing points P1, P2, P3 and P4. In this embodiment, the contact hole 56 is a pentagon, also.

Next, phosphorus is introduced by ion implantation in a dose of $5-10^{15}$ cm$^{-2}$ by applying an accelerating voltage of 40 KeV, using the wiring layer 60 as a mask. Then, a thermal treatment is carried out for an activation to form a source or a drain region 63A. Hereafter, an explanation is done referring the region 53A as a source region.

Figure 11B:
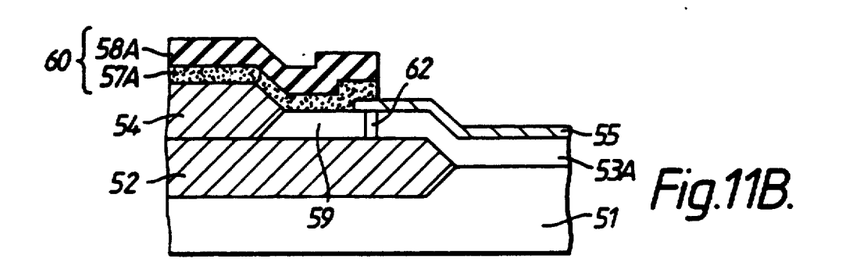
FIGS. 11B to 11D are cross sectional views, for explaining the steps of manufacturing another embodiment of this invention.
Figure 11C:
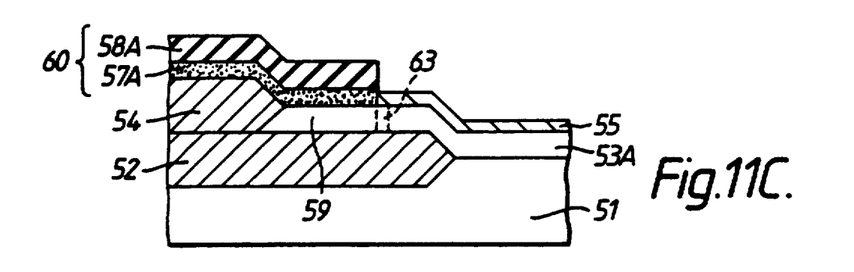
Figure 11D:
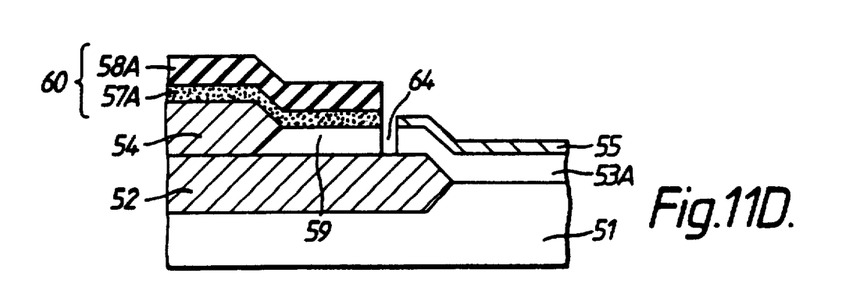

After that, an interlayer insulator (not shown) is formed, and planarization is carried out using a well known technique. Then, a contact hole is formed. a metalic layer is formed, and the metalic layer is patterned to form a wiring layer (not shown), using conventional process. FIGS. 11B to 11D are cross sectional views along the lines I—I, II—II and III—III of FIG. 11A, respectively. As shown in FIG. 11B, at the portion where the wiring layer 60 projects portion 62 between the underlying diffused layer 59 and the source region 53A.

On the contrary, there exists a connection portion 63 at the crossing point P2, since the underlying diffused region 59 and a source region 53A overlaps. Namely, the surface of the underlying region 59 is not subjected to the etching process for the patterning of the wiring layer 60, due to the existence of the insulating layer 55. Thus, no unfavorable trench region is formed.

At the portion where the wiring layer 60 ends within the contact hole 56, there exists an unfavorable trench region 64.

However, as explained previously, at the crossing point P2, the underlying region 59 and the source region 53A contact each other. Therefore, an electrical conductive path between the wiring layer 60 and the source region 53A is certainly obtained.

In the prescibed embodiment, the contact hole is a pentagon. However. the shape is not limited to a pentagon. Namely, as long as there exists crossing points over an element region, the connection between the wiring layer and the element region is obtained.

Figure 12:
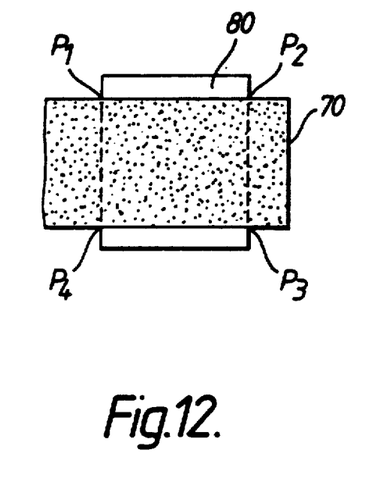
FIGS. 12 and 13 are plan views of a wiring layer and a contact hole of further embodiments of this invention.

In FIG. 12, a wiring layer 70 extends from separation region (left side) and projects over an element region (right side) to form crossing points P2, P4 over the element region, crossing a square contact hole 80. As the leading edge of the wiring layer 70 lies on the element side, there is no gap between the leading edge of the wiring layer 70 and the insulating layer forming the square contact hole 80 to expose the surface of the substrate to an etching process. Thus, no unfavorable trench between the wiring and the element is formed during the etching process for the patterning of the wiring.

Figure 13:
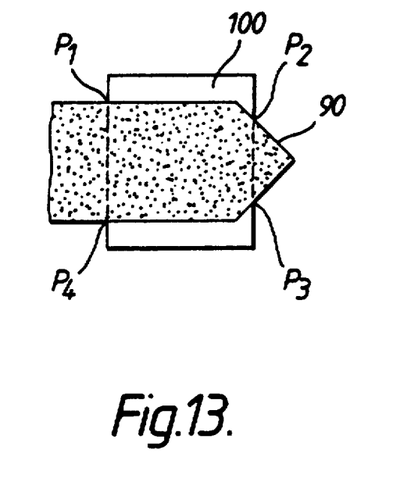

In FIG. 13, a wiring layer 90 having triangle leading edge crosses a contact hole 100 of square to form crossing points P2, P4 over the area where an element is formed thereunder. By similar reasoning in the embodiment of FIG. 12, a conductive path between the wiring layer 90 and an element region (not shown) is certainly obtained.

The present invention has been described with respect to a specific embodiment. However, other embodiments based on the principles of the present invention should be obvious to those of ordinary skill in the art. Such embodiments are intended to be covered by the claims.

What is claimed is:

1. In a semiconductor device comprising, a semiconductor substrate of a first conductivity type, an insulating layer formed on the substrate, an opening in the insulating layer exposing a portion of the substrate, a wiring layer containing impurities of a second conductivity type, a diffused region in the exposed portion of the substrate containing diffused impurities from the wiring layer, and an element region of the second conductivity type containing implanted impurities of the second conductivity type;

the improvement comprising, the opening being in the shape of a pentagon and the wiring layer crossing a perimeter of the opening at least least four locations of direct contact between the wiring layer and the diffused region to connect the wiring layer with the element region through the diffused region.

* * * * *